(12) United States Patent
Tsai et al.

(10) Patent No.: US 6,465,294 B1
(45) Date of Patent: Oct. 15, 2002

(54) SELF-ALIGNED PROCESS FOR A STACKED GATE RF MOSFET DEVICE

(75) Inventors: Chaochieh Tsai, Hsin-chu (TW); Chung-Long Chang, Dou-Liu (TW); Ju-Yu Chang, Hsin-chu (TW); Shyh-Chyi Wong, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/808,928

(22) Filed: Mar. 16, 2001

(51) Int. Cl.$^7$ .......................................... H01L 21/8238
(52) U.S. Cl. ...................... 438/217; 438/303
(58) Field of Search .................. 438/229, 257, 438/299, 303, 305, 592, 639, 683, 694, 723, 757, 217, 281, 300

(56) References Cited

U.S. PATENT DOCUMENTS 5,744,395 A * 4/1998 Shue et al.
6,258,678 B1 * 7/2001 Liaw
6,300,201 B1 * 10/2001 Shao et al.

* cited by examiner

*Primary Examiner*—David Nelms
*Assistant Examiner*—Phuc T. Dang
(74) *Attorney, Agent, or Firm*—George O. Saile; Stephen B. Ackerman

(57) ABSTRACT

A process for fabricating an RF type, MOSFET device, concentrating on reducing performance degrading gate resistance, has been developed. The process features formation of a stacked gate structure, comprised of a metal gate contact structure located directly overlying a portion of an underlying polysilicon gate structure, in a region in which the polysilicon gate structure is located on an active device region of a semiconductor substrate. Subsequent formation of an overlying metal interconnect structure, results in reduced gate resistance due to the direct vertical conductive path from the metal interconnect structure to the polysilicon gate structure, through the metal gate contact structure. A novel process sequence, requiring no photolithographic processing, is used to self-align the metal gate contact structure to the underlying polysilicon gate structure.

17 Claims, 6 Drawing Sheets

SELF-ALIGNED PROCESS FOR A STACKED GATE RF MOSFET DEVICE

BACKGROUND OF THE INVENTION (1) Field of the Invention

The present invention relates to methods used to fabricate semiconductor devices, and more specifically to a method used to fabricate an RF metal oxide semiconductor field effect transistor (MOSFET), device, featuring a stacked metal gate structure, self-aligned to, and formed directly overlying, a polysilicon gate structure.

(2) Description of Prior Art

To achieve the objective of a system on a chip (SOC), comprised with various MOSFET type devices, the fabrication procedures for such MOSFET devices, such as base-band or digital, as well as RF type devices, have to be integrated. However the RF type MOSFET devices are designed to supply enhanced performance when compared to other MOSFET type devices of the SOC application, therefore the RF MOSFET devices have to be comprised with specific features that will enhance device performance. Reducing gate resistance, as well as reducing contact resistance for the RF MOSFET devices, can result in the desired performance enhancements. This invention will describe a process for integrating the higher performing RF MOSFET type devices, with digital type MOSFET type devices, for the SOC application, with the RF MOSFET type device featuring a metal gate contact structure, formed self-aligned to, and directly on, an underlying MOSFET gate structure, in a region in which the gate structure resides overlying a semiconductor active device region, therefore eliminating the gate resistance (Rg), increase experienced with counter-part designs in which contact to a gate structure is accomplished in a region away from the active device region, resulting in long and resistive paths. In addition this invention will feature larger openings to source/drain regions, thus reducing contact resistance (Rc), of the RF MOSFET device when compared to counterpart type devices fabricated with smaller openings to source/drain regions. Prior art, such as Givens et al, in U.S. Pat. No. 5,268,330, describe a method of forming a metal contact structure to an underlying polycide gate structure, however this prior art does not employ the novel procedure used to self-align the metal gate contact structure to an underlying polysilicon, or polycide structure.

SUMMARY OF THE INVENTION

It is an object of this invention to fabricate a RF type, MOSFET device, for a system on chip (SOC), application.

It is another object of this invention to form a stacked gate structure for the RF type MOSFET device, comprised of a metal gate contact structure, formed self-aligned to, and directly on, an underlying MOSFET gate structure, in a region in which the gate structure resides on an active device region of the semiconductor substrate, to reduce gate resistance via direct current flow from an overlying metal interconnect structure through the stacked gate structure.

It is another object of this invention to form a dual damascene type, stacked gate trench shape, in a silicon oxide-silicon nitride-silicon oxide, composite layer, to accommodate the metal gate contact structure of the stacked gate structure, via creation narrow diameter openings in silicon nitride layer, to be used as an etch mask to define the narrow diameter opening of the dual damascene opening, with the narrow diameter openings in the silicon nitride layer formed via removal of a raised portion of the silicon nitride layer, in a region in which the silicon nitride layer directly overlaid the top surface of the gate structure.

It is still yet another object of this invention to increase the area of the RF type MOSFET source/drain contact openings via use of rectangular contact openings, to reduce the contact resistance, and this enhance device performance.

In accordance with the present invention a process of forming a stacked gate MOSFET structure for a RF type MOSFET device, featuring a metal gate contact structure component self-aligned to, and directly overlying the MOSFET polysilicon gate structure, in a region in which the gate structure resided overlying an active device region in the semiconductor substrate, is described. After formation of the MOSFET polysilicon gate structure, comprised with an overlying layer of metal silicide, comprised with silicon nitride spacers on the sides of the MOSFET gate structure, and comprised with a source/drain region located in an area of the semiconductor active device region not covered by the MOSFET polysilicon gate structure, a first silicon oxide layer is deposited, resulting in a raised portion of the first silicon oxide located only overlying the top surface of the MOSFET polysilicon gate structure. A thin silicon nitride layer is then deposited, contouring the raised, or bumped topography, of the underlying first silicon oxide layer. A chemical mechanical polishing (CMP), procedure is employed to remove the portion of the thin silicon nitride layer overlying the raised portion of first silicon oxide layer, resulting in a silicon nitride masking layer, now comprised with small diameter openings which expose regions of the first silicon oxide layer, in regions where the first silicon oxide layer directly overlays the top surface of the MOSFET polysilicon gate structures. After deposition of a second silicon oxide, a photoresist shape is used as an etch mask to define a large diameter opening in the second silicon oxide layer, exposing the silicon nitride masking layer, comprised with the small diameter openings. The etch process is continued to selectively remove portions of the first silicon oxide layer, exposed in the small diameter openings in the silicon nitride masking layer, resulting in a dual damascene opening, or stacked gate trench shape, comprised of a large diameter opening in the second silicon oxide layer, and a smaller diameter opening in the silicon nitride masking layer, and in the first silicon oxide layer, exposing a portion of the top surface of the MOSFET polysilicon gate structure, in a region in which the MOSFET polysilicon gate structure overlays an active device region. A metal layer is deposited and subjected to a CMP procedure, to create the metal gate contact structure, in the dual damascene opening, overlying the MOSFET polysilicon gate structure in a region in which the MOSFET polysilicon gate structure overlays an active device region. A metal interconnect structure is then formed on the metal gate contact structure, resulting in vertical current flow from the metal interconnect structure to MOSFET, stacked gate structure, reducing gate resistance when compared to counterparts in which contact to the MOSFET polysilicon gate structure is accomplished over non-active device areas, requiring long, resistive polysilicon gate lengths.

Rectangular shaped, contact hole openings, are also formed to the source/drain region of the RF type MOSFET device, to allowing for larger contact regions, thus reducing source/drain contact resistance, when compared to counter-parts fabricated with smaller area, non-rectangular, contact hole openings.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
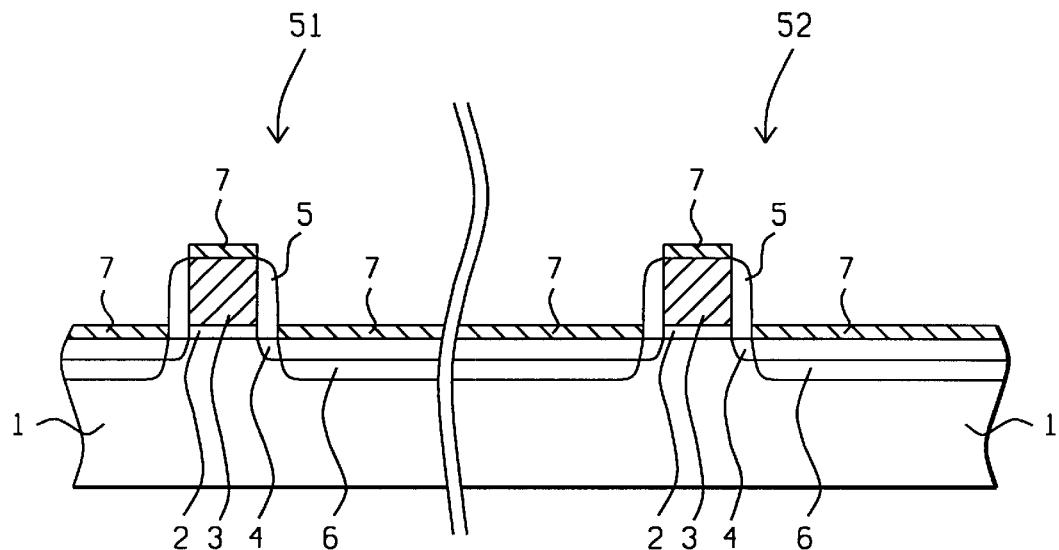
FIGS. 1–4, 5B, 6–8, and 9B, which schematically, in cross-sectional style, describe key stages of integrating the fabrication of an RF type MOSFET device, with the fabrication of a baseband or digital MOSFET device, where the RF type MOSFET device is comprised with a stacked gate structure, featuring a metal gate contact structure, overlying and formed self-aligned to, an underlying MOSFET polysilicon gate structure, in a region in which the MOSFET polysilicon gate structure is located in on an active device region.
Figure 9A:
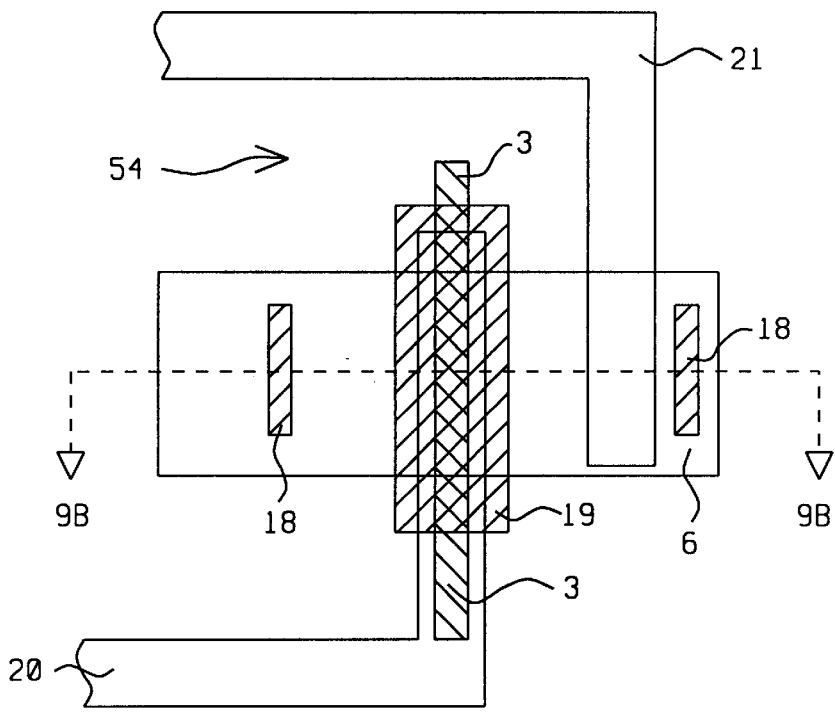

The method of integrating the fabrication of a MOSFET device, to be used for RF applications, with the fabrication of other MOSFET devices, used for baseband or digital applications, will now be described in detail. The RF type MOSFET device will be fabricated with features designed to minimize resistance and thus enhance performance, such as a metal gate contact structure, formed overlying and self-aligned to, an underlying MOSFET polysilicon gate structure, in a region in which the MOSFET polysilicon gate structure is located on an active device region. The MOSFET device, with enhanced performance, to be used for RF applications will be referred to in the drawings as MOSFET device 52, while the MOSFET device used for baseboard or digital applications will be referred to in the drawing as MOSFET device 51. A P type, semiconductor substrate 1, comprised of single crystalline silicon, with a <100> crystallographic orientation, is used and schematically shown in FIG. 1, for both MOSFET devices. An non-active device region 54, used in both MOSFET device 51, and MOSFET device 52, will be shown schematically in top view FIG. 5A, as well as in top view FIG. 9A. Non-active device region 54, is comprised of a thick silicon oxide layer, such as a field oxide (FOX), region, formed on a portion of semiconductor substrate 1. Gate insulator layer 2, comprised of silicon dioxide, is formed at a thickness between about 10 to 150 Angstroms, on portions of semiconductor substrate 1, to be used for the active device region. Deposition of a polysilicon layer is next addressed via low pressure chemical vapor deposition (LPCVD), procedures, to a thickness between 500 to 3000 Angstroms. The polysilicon layer can be doped in situ during deposition, via the addition of arsine or phosphine to a silane ambient, or the polysilicon layer can be deposited intrinsically then doped via implantation of phosphorous or arsenic ions. Conventional photolithographic and reactive ion etching (RIE), procedures, are next employed, using $SF_6$ or $Cl_2$, as an etchant to define polysilicon gate structures 3, for both MOSFET devices, shown schematically in FIG. 1. The width of polysilicon gate structures 3, is between about 0.04 to 5.0 um. If desired a polycide gate structure, comprised of a metal silicide layer such as tungsten silicide or titanium silicide, on polysilicon, can be used in place of a polysilicon gate structure. Lightly doped, N type source/drain regions 4, are next formed, followed by formation of silicon nitride spacers 5, at a thickness between about 800 to 2000 Angstroms, located on the sides of gate structures 3. After formation of heavily doped, N type source/drain regions 6, metal silicide layers 7, such as cobalt silicide, nickel silicide, or titanium silicide, are selectively formed on the top surface of gate structures 3, and on the top surface of heavily doped, N type source drain region 6. The result of these process steps are schematically shown in FIG. 1.

Figure 2:
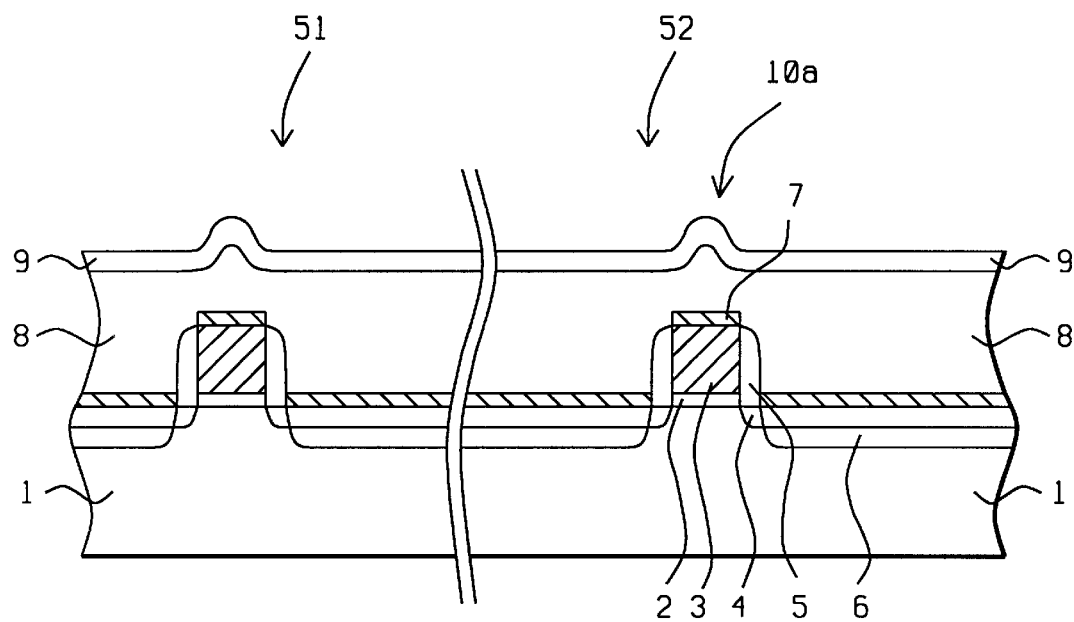

First interlevel dielectric (ILD), layer 8, comprised of silicon oxide, is next deposited at a thickness between about 2500 to 3500 Angstroms, via PECVD or LPCVD procedures. The topology of first ILD layer 8, features a raised region, or bump 10a, in the region in which first ILD layer 8, overlaid polysilicon gate structure 3. Subsequent deposition of silicon nitride layer 9, transfers the topology of bump 10a, to the silicon nitride layer. Silicon nitride layer 9, is obtained at a thickness between about 250 to 350 Angstroms, via LPCVD or PECVD procedures. The height of bump 10a, is between about 50 to 1000 Angstroms, while the width of bump 10a, is between about 0.05 to 5.0 um. The result of these procedures is schematically shown in FIG. 2.

Figure 3:
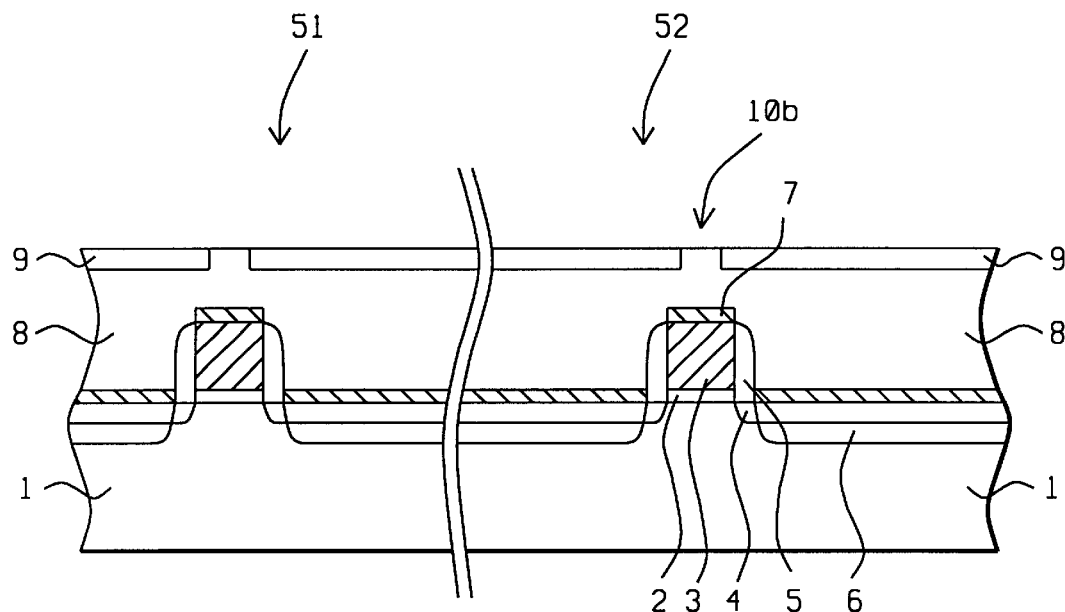
Figure 4:
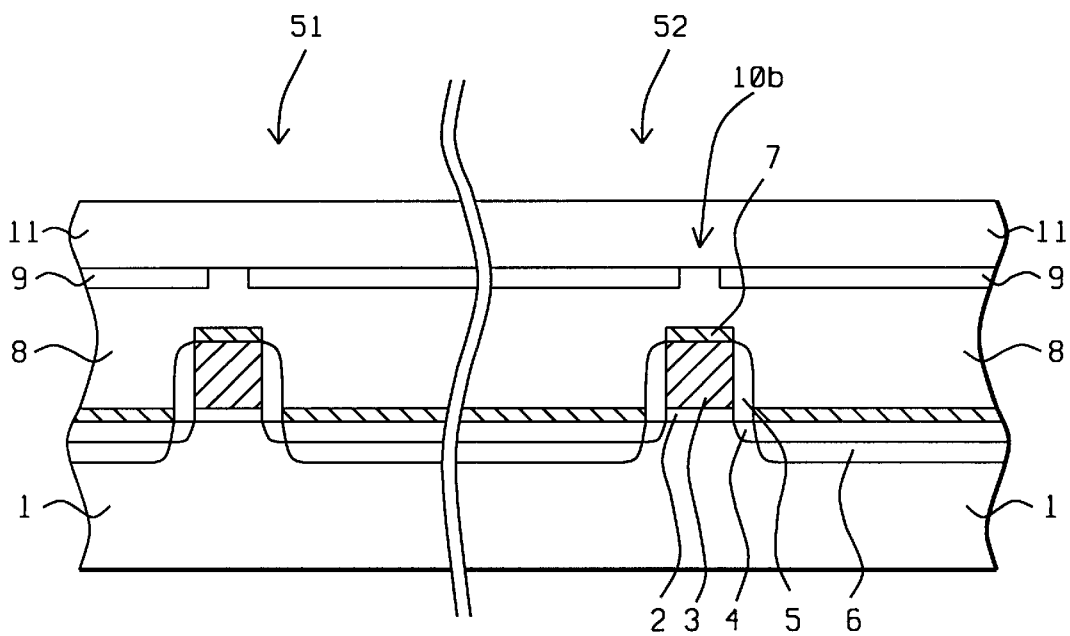

A critical procedure, used to remove bump 10a, and to create opening 10b, in silicon nitride layer 9, is next addressed and schematically described in FIG. 3. A CMP procedure is employed to planarize the top surface of silicon nitride layer 9, and in so doing remove raised regions, or bump 10a. The result of the CMP procedure is the creation of opening 10b, in silicon nitride layer 9. Opening 10b, formed at width between about 0.04 to 1.0 um, exposes a portion of the top surface of first ILD layer 8. If desired a photolithographic and dry etch procedure can be used to remove raised region or bump 10a, again resulting in the creation of opening 10b. A second ILD layer 11, comprised of silicon oxide, is next deposited via PECVD or LPCVD procedures, to a thickness between about 2000 to 3000 Angstroms. This is schematically shown in FIG. 4.

Figure 5A:
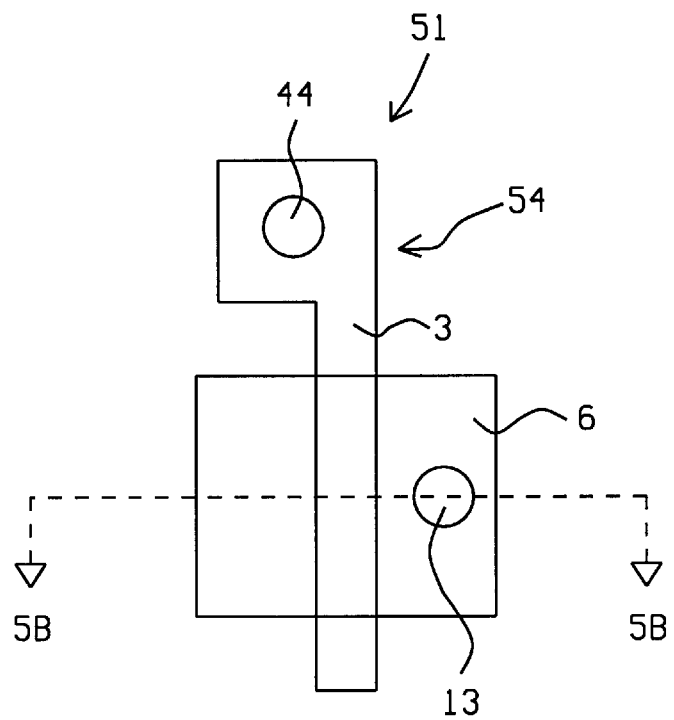
FIGS. 5A and 9A, which schematically show a top view of these MOSFET structures, at specific stages of fabrication.
Figure 5B:
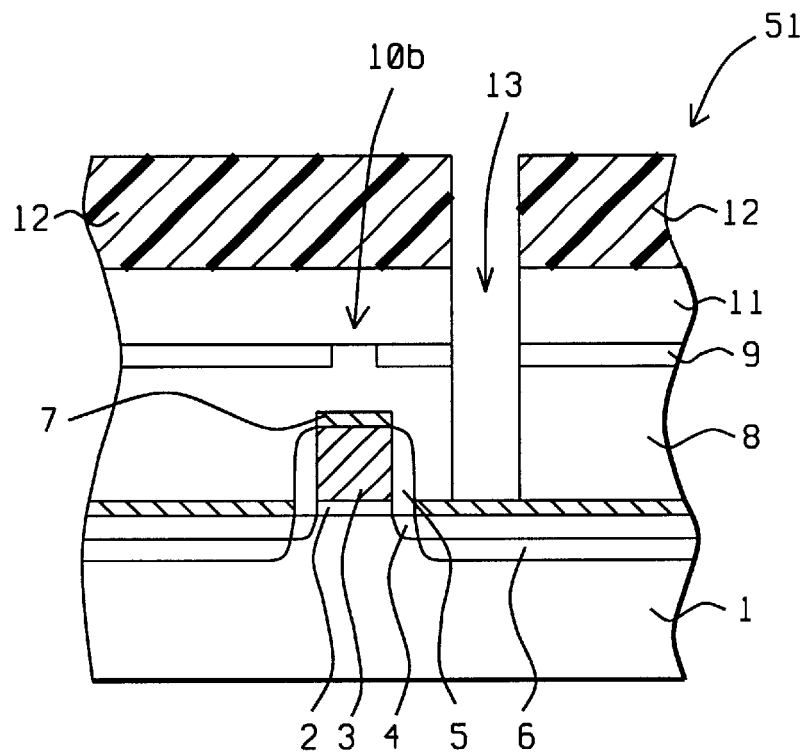

Contact holes to heavily doped source/drain region 6, and to polysilicon gate structure 3, for MOSFET device 51, are next formed, and schematically shown in FIGS. 5A and 5B. Photoresist shape 12, is formed and used as an etch mask to allow a RIE procedure to define contact hole 13, in second ILD layer 11, silicon nitride layer 9, and in first ILD layer 8, exposing a top portion of metal silicide layer 7, in a region in which metal silicide layer 7, directly overlays heavily doped source/drain region 6. The RIE procedure is performed using $CHF_3$ or $CF_4$ as an etchant for the ILD layer and for the silicon nitride layer. This is shown schematically in FIG. 5A, as well as in FIG. 6. The same photolithographic and RIE procedure is also used to form contact hole 44, in second ILD layer 11, in silicon nitride layer 9, and in a top portion of first ILD layer 8, exposing a portion of polysilicon gate structure 3, in a region in which polysilicon gate structure 3, overlays silicon oxide FOX region 54. This is schematically shown as a top view in FIG. 5A. This type of contact for gate structures results in additional resistance resulting from the distance or length, between a subsequent metal gate contact structure, in gate contact opening 54, and the MOSFET channel region, where the polysilicon gate structure overlays an active device region.

Figure 6:
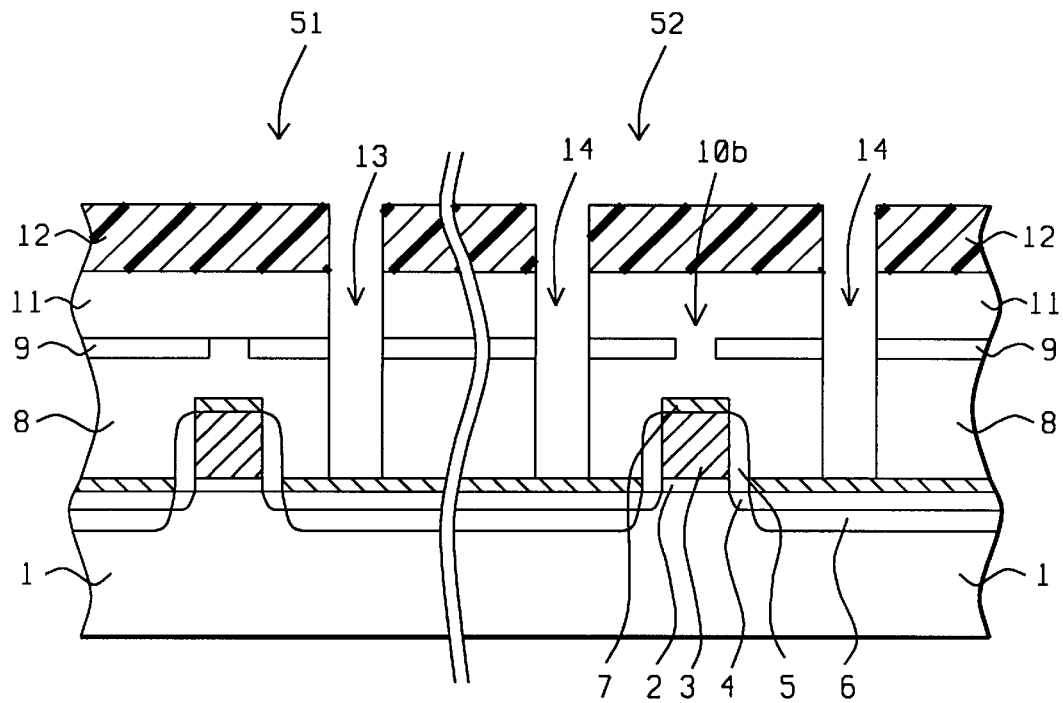

The same photolithographic and RIE procedure used to create contact opening 13, to a source/drain region of MOSFET device 51, is also used to simultaneously form contact holes 14, to the metal silicide layer overlying the heavily doped source/drain regions of MOSFET device 52. This is schematically shown in FIG. 6. Contact holes 14, are comprised with a rectangular shape, to increase contact area, and thus reduce contact resistance for the higher performing, RF type, MOSFET device 52. The rectangular shaped contact holes, to source/drain regions of MOSFET device 52, are shown schematically in a top view of FIG. 9A. The opening to polysilicon gate structure 3, for MOSFET device 52, is not performed during the opening of source/drain contact holes 14. Photoresist shape 12, is removed via plasma oxygen ashing and careful wet cleans.

Figure 7:
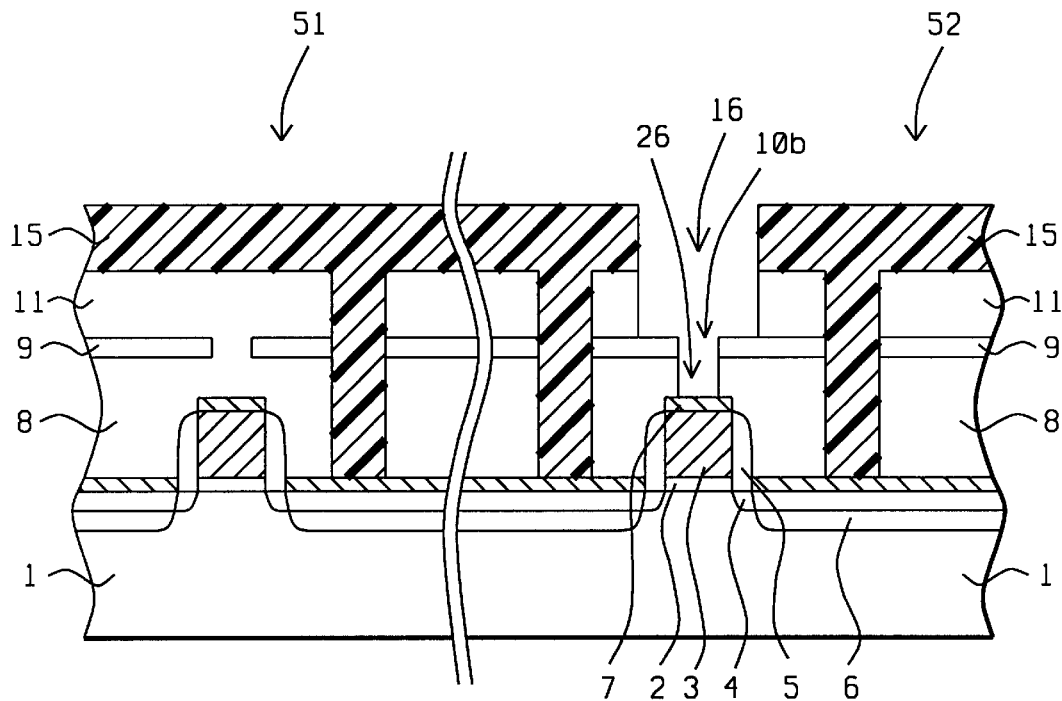

To further increase performance for MOSFET device 52, a stacked gate concept, in which contact to the polysilicon gate structures is made in a region in which the polysilicon gate structure directly overlays an active device region, is next addressed. The ability to form a gate contact structure to the polysilicon gate structure, directly over an active device region, reduces gate resistance when compared to counterparts, comprised with the contact to the polysilicon gate structure accomplished in non-active regions, inducing long polysilicon runs, increasing resistance and adversely impacting gate resistance. The procedure for creating a dual damascene type opening, or a stacked gate trench, to a region of polysilicon gate structure 3, of MOSFET device 52, overlying an active device region, to allow a metal gate contact structure to be self-aligned to the polysilicon gate structure, is next addressed and schematically shown in FIG. 7. Photoresist shape 15, is formed and used as a mask to create wide opening 16, in second ILD layer 11, via a selective RIE procedure using $CHF_3$ as an etchant, exposing the top surface of silicon nitride layer 9, as well as exposing opening 10b, in silicon nitride layer 9, which in turn exposes a portion of the top surface of first ID layer 8. The high etch rate of silicon oxide, when compared to the slower etch rate of silicon nitride, in this etch ambient allows silicon nitride layer 9, to survive the procedure of forming wide opening 16, in second ILD layer 11. The selective RIE procedure is then continued, using the portion of silicon nitride layer 9, exposed in wide opening 16, as an etch mask, to selectively remove the portion of first ILD layer 8, exposed in opening 10b, resulting in narrow diameter opening 26, between about 0.04 to 1.0 um in width, in first ILD layer 8, exposing a portion of polysilicon gate structure 3, (covered by metal silicide layer 7), in an active device region. The dual damascene opening, or stacked gate trench shape, comprised of wide diameter opening 16, and narrow diameter opening 26, will now allow accommodation of a metal gate contact structure, self-aligned to the underlying polysilicon gate structure, in a region in which polysilicon gate structure 3, resides in an active device region of MOSFET device 52. The creation and removal of the raised or bump in first ILD layer 8, allowed narrow diameter opening 10b, to be realized, thus enabling self-alignment of a subsequent metal gate contact structure to an underlying polysilicon gate structure, to be accomplished.

Figure 8:
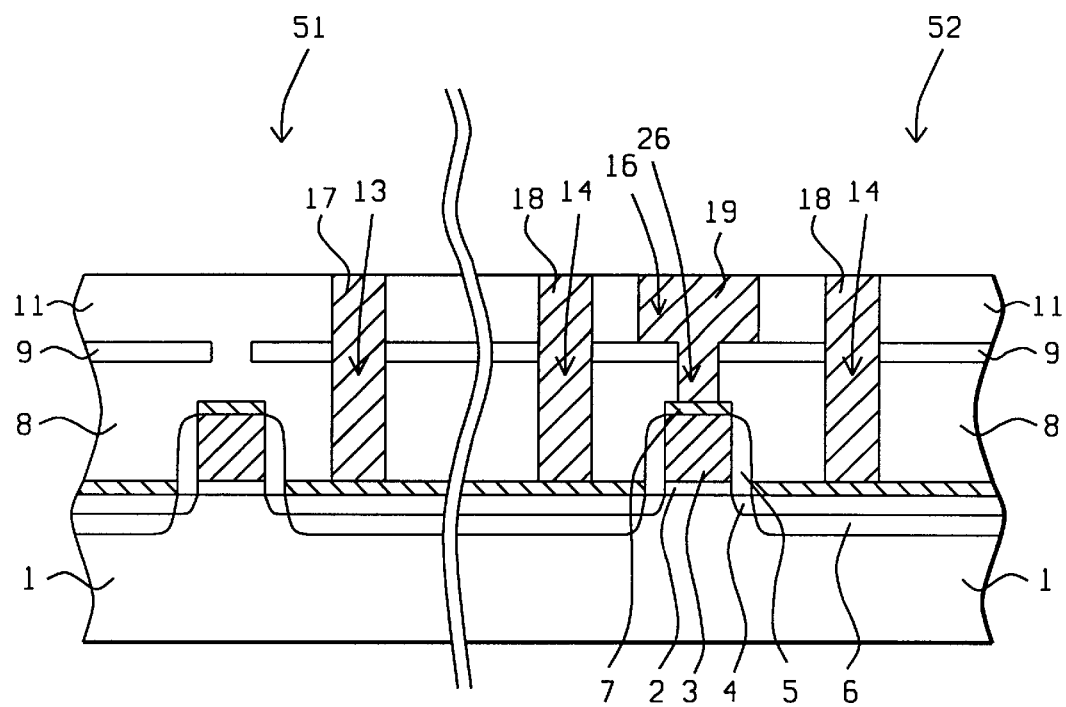

After removal of photoresist shape 15, via plasma oxygen ashing and careful wet cleans, a barrier layer of titanium nitride, and a metal layer, such as tungsten, is deposited, completely filling contact hole 13, for MOSFET device 51, and completely filling contact holes 14, and the dual damascene opening, for MOSFET device 52. The titanium nitride layer is deposited via plasma vapor deposition procedures, to a thickness between about 250 to 500 Angstroms, while the tungsten layer is deposited to a thickness between about 3000 to 8000 Angstroms, using either plasma vapor deposition, or chemical vapor deposition procedures. Removal of regions of tungsten and titanium nitride, from the top surface of second ILD layer 11, is accomplished via a CMP procedure, or via a selective RIE procedure, using $Cl_2$ or $SF_6$ as an etchant for these layers. This results in the formation of metal contact structure 17, in contact hole 13, for MOSFET device 51, as well as metal contact structures 18, in rectangular contact holes 14, for MOSFET device 52. In addition, and of greater importance, metal gate contact structure 19, is formed in the dual damascene opening, self-aligned to, and overlaying a region of polysilicon gate structure 3, in a region in which polysilicon gate structure 3, resides in an active device region of RF type, MOSFET device 52. This is schematically shown in FIG. 8. The fin type, metal gate contact structure 19, will allow vertical current flow from a subsequent overlying metal interconnect structure, through the metal gate structure, to the polysilicon gate structure located on an active device region.

Figure 9B:
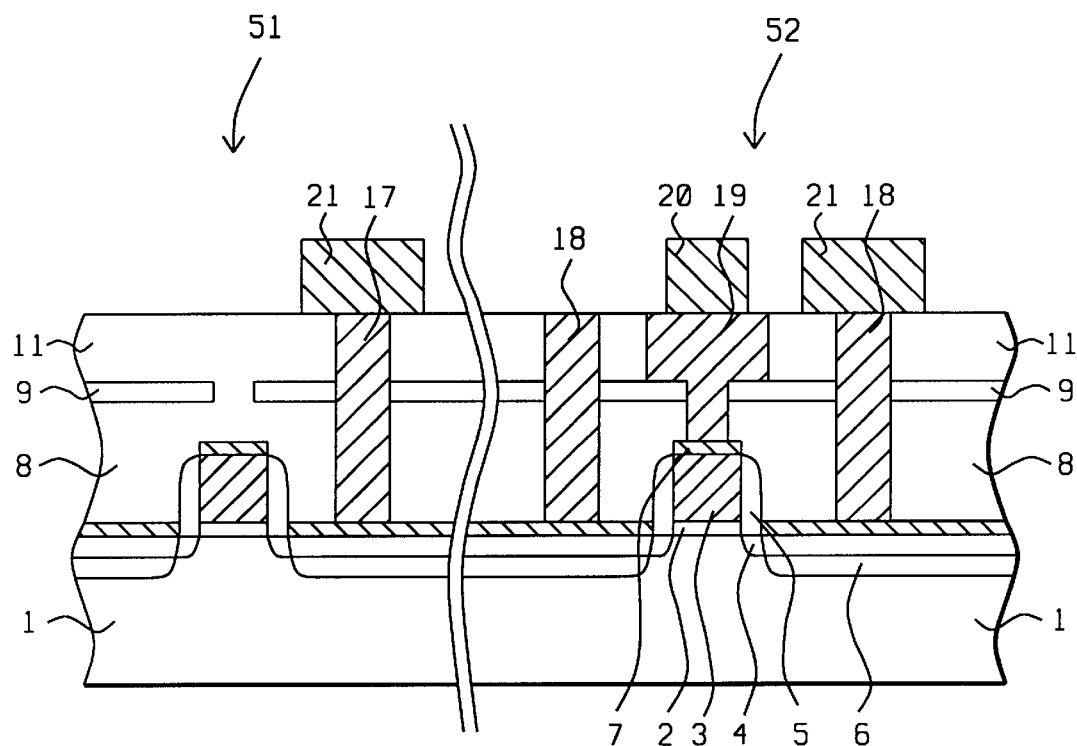

The formation of lower level metal interconnects structures for MOSFET device 51, and for MOSFET device 52, including formation of a lower level metal interconnect structure to metal gate contact structure 19, is next addressed and schematically shown, in cross-sectional style in FIG. 9B. A metal layer, such as aluminum-copper, tungsten, or copper, is deposited via plasma vapor deposition procedures, to a thickness between about 1000 to 5000 Angstroms. Conventional photolithographic and RIE procedures, using $Cl_2$ or $SF_6$ as an etchant, are employed to define metal interconnect structures 21, overlying and contacting, metal contact structures to source/drain regions in both MOSFET type devices. In addition lower level metal interconnect structure 20, directly overlays and contacts, underlying metal gate contact structure 19, for MOSFET device 52. Therefore a direct vertical current flow, minimizing gate resistance, and enhancing MOSFET performance, is established from lower level metal interconnect structure 20, through metal gate contact structure 19, and into a region of polysilicon gate structure 3, located on an active device region of MOSFET device 52. The photoresist shape used for definition of the metal interconnect structures is again removed using plasma oxygen ashing and careful wet clean procedures. It should be noted that a conductive connection to source region of heavily doped source/drain region 6, is not made by the lower level metal interconnect structures, but is made using an upper level metal interconnect structure. The upper level metal interconnect structure is not shown in the drawings. If desired lower level metal interconnect structures can be defined using a damascene procedure, in which an opening in a third ILD layer, (not shown in the drawings), is made, exposing the top surface of the metal contact structures, as well as the top surface of the metal gate contact structure. A metal layer is then deposited, then removed from the top surface of the third ILD layer, resulting in lower level metal interconnect structures embedded in the openings in the third ILD layer, overlying and contacting the metal contact, and metal gate contact structures.

FIG. 9B, schematically shows a top view of MOSFET device 52, after formation of lower level metal interconnect structure 21, to metal contact structure 18, which in turn contacts the rectangular shaped source/drain region 6. Lower level metal interconnect structure 20, is shown overlying metal gate contact structure 19, which in turn overlays and contacts polysilicon gate structure 3, in a region in which the polysilicon gate structure resides in an active device region of RF type, MOSFET device 52.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a MOSFET device on a semiconductor substrate, featuring a stacked gate structure comprised of a metal gate contact structure, directly overlying a polysilicon gate structure, in a region in which said polysilicon gate structure, defined on an underlying gate insulator layer, is located on a portion of an active device region of said semiconductor substrate, comprising the steps of:

forming said polysilicon gate structure on said gate insulator layer, on said active device region of said semiconductor substrate;

forming silicon nitride spacers on the sides of said polysilicon gate structure;

forming a heavily doped source/drain region in a portion of said active device region of said semiconductor substrate not covered by said polysilicon gate structure, or by said silicon nitride spacers;

forming a metal silicide layer on the top surface of said polysilicon gate structure, and on the top surface of said heavily doped source/drain region;

depositing a first ILD layer, with the topology of said first ILD comprised with a raised portion in a region in which said first ILD layer overlays the top surface of said polysilicon gate structure;

depositing a silicon nitride layer on said first ILD layer, resulting in a raised portion of said silicon nitride layer, in a region overlying said raised portion of said first ILD layer;

performing a chemical mechanical polishing (CMP), procedure to remove said raised portion of said silicon nitride layer, and to remove said raised portion of said first ILD layer, resulting in an opening in said silicon nitride layer, exposing a portion of said first ILD layer, in a region in which said first ILD layer directly overlays the top surface of said polysilicon gate structure;

depositing a second ILD layer;

forming rectangular shaped, contact holes, in said second ILD layer, in said silicon nitride layer, and in said first ILD layer, exposing a portion of said heavily doped source/drain region;

forming a metal gate contact trench shape, comprised of a wide diameter opening in said second ILD layer, exposing a portion of the top surface of said silicon nitride layer, and exposing said opening in said silicon nitride layer, and comprised of a narrow diameter opening in a top portion of said first ILD layer, formed using said opening in said silicon nitride layer as a mask, exposing a portion of the top surface of said polysilicon gate structure, in a region in which said polysilicon gate structure is located on said active device region of said semiconductor substrate;

depositing a metal layer completely filling said rectangular shaped contact holes, and completely filling dual said metal gate contact trench shape;

removing regions of said metal layer from the top surface of said second ILD layer, resulting in the formation of metal contact structures in said rectangular shaped, contact holes, and resulting in the formation of a metal gate contact structure, in said metal gate contact trench shape, resulting in said stacked gate structure, comprised of said metal gate contact structure overlying and contacting said polysilicon gate structure, in a region in which said polysilicon gate structure is located on said active device region of said semiconductor substrate; and forming lower level metal interconnect structures, with first lower level metal interconnect structure located overlying and contacting a metal contact structure, and with a second lower level metal interconnect structure overlying and contacting said stacked gate structure.

2. The method of claim 1, wherein the width of said polysilicon gate structure is between about 0.04 to 5.0 um.

3. The method of claim 1, wherein said first ILD layer, is a silicon oxide layer, obtained via LPCVD or PECVD procedures, at a thickness between about 2500 to 3500 Angstroms.

4. The method of claim 1, wherein said silicon nitride layer is obtained via LPCVD or PECVD procedures, at thickness between about 250 to 350 Angstroms.

5. The method of claim 1, wherein the width of said opening, in said silicon nitride layer, is between about 0.04 to 1.0 um.

6. The method of claim 1, wherein said second ILD layer is a silicon oxide layer, obtained via LPCVD or PECVD procedures, at a thickness between about 2000 to 3000 Angstroms.

7. The method of claim 1, wherein the width of said narrow opening of said metal gate contact trench shape, in said top portion of said second ILD layer, is between about 0.10 to 5.0 um.

8. The method of claim 1, wherein said metal gate contact structure, located in said metal gate contact trench shape, is comprised of an underlying titanium nitride barrier layer, at a thickness between about 250 to 500 Angstroms, and an overlying tungsten layer, at a thickness between about 3000 to 8000 Angstroms.

9. A MOSFET device structure on a semiconductor substrate, featuring a metal interconnect structure, directly overlying a stacked gate structure which in turn is comprised of a metal gate contact structure, directly overlying a gate structure, in a region in which the gate structure resides an active device region of said semiconductor substrate, comprising:

said gate structure, on an underlying gate insulator layer, located overlying said active device region of said semiconductor substrate;

a lightly doped source/drain region in a portion of said active device region of semiconductor substrate not covered by said gate structure;

insulator spacers on the sides of said gate structure;

a heavily doped source/drain region in a portion of said active device region of said semiconductor substrate not covered by said gate structure, or by insulator spacers;

metal silicide on the top surface of said gate structure, and on the top surface of said heavily doped source/drain region;

a first interlevel dielectric layer (ILD) on said metal silicide wherein said metal silicide is located on top surface said heavily doped source/drain region, and on top surface of said gate structure;

a silicon nitride layer on said first ILD layer;

a metal contact trench shape in a second interlevel dielectric (ILD), layer, in said silicon nitride layer, and in a top portion of said first ILD layer, exposing a portion of the top surface of said gate structure, and with said metal contact trench shaped comprised with a wide diameter opening in said second ILD layer, and comprised with a narrow diameter opening in said silicon nitride layer, and in the top portion of said first ILD layer;

rectangular shaped contact holes in said second ILD layer, in said silicon nitride layer, and in said first ILD layer, exposing portions of said heavily doped source/drain region;

said metal gate contact structure located in said metal contact trench shape, overlying and contacting said gate structure, in a region in which said gate structure is located overlying said active device region of said semiconductor substrate;

metal contact structures located in said rectangular shaped contact holes, overlying and contacting exposed portions of said heavily doped source/drain region;

a first lower level metal interconnect structure located directly overlying said metal gate contact structure, resulting in a conductive vertical path from said first metal interconnect structure to said metal gate contact structure to said gate structure; and a second lower level metal interconnect structure overlying and contacting a metal contact structure.

10. The MOSFET device structure of claim 9, wherein said gate structure is comprised of polysilicon, at a thickness between about 500 to 3000 Angstroms, doped with either arsenic or phosphorous.

11. The MOSFET device structure of claim 9, wherein said insulator spacers are comprised of silicon nitride, at a thickness between about 800 to 2000 Angstroms.

12. The MOSFET device structure of claim 9, wherein said metal silicide layer is comprised of either cobalt silicide, nickel silicide, or titanium silicide.

13. The MOSFET device structure of claim 9, wherein said first ILD layer is a silicon oxide layer, at a thickness between about 2500 to 3500 Angstroms.

14. The MOSFET device structure of claim 9, wherein the thickness of said silicon nitride layer is between about 250 to 350 Angstroms.

15. The MOSFET device structure of claim 9, wherein said second ILD layer is a silicon oxide layer, at a thickness between about 2000 to 3000 Angstroms.

16. The MOSFET device structure of claim 9, wherein the diameter of said narrow diameter opening, in said silicon nitride layer, and in a top portion of said first ILD layer, of said metal contact trench shape, is between about 0.04 to 1.0 um.

17. The MOSFET device structure of claim 9, wherein said metal gate contact structure, located in said metal gate contact trench shape, is comprised of an underlying titanium nitride barrier layer, at a thickness between about 250 to 500 Angstroms, and an overlying tungsten layer, at a thickness between about 3000 to 8000 Angstroms.

* * * * *

UNITED STATES PATENT AND TRADEMARK OFFICE
CERTIFICATE OF CORRECTION

PATENT NO. : 6,465,294 B1
DATED : October 15, 2002
INVENTOR(S) : Chaochieh Tsai et al.

It is certified that error appears in the above-identified patent and that said Letters Patent is hereby corrected as shown below:

<u>Title page,</u>
Item [75], delete "Ju-Yu Chang", and replace with -- Jui-Yu Chang --.

Signed and Sealed this

Twenty-fifth Day of March, 2003

JAMES E. ROGAN
*Director of the United States Patent and Trademark Office*